US005227362A

United States Patent [19]
Ovshinsky et al.

[11] Patent Number: 5,227,362
[45] Date of Patent: * Jul. 13, 1993

[54] PARAMETRICALLY MODIFIED SUPERCONDUCTOR MATERIAL

[75] Inventors: Stanford R. Ovshinsky, Bloomfield Hills; Rosa Young, Troy, both of Mich.

[73] Assignee: Ovonic Synthetic Materials Company, Inc., Troy, Mich.

[*] Notice: The portion of the term of this patent subsequent to Apr. 2, 2008 has been disclaimed.

[21] Appl. No.: 826,290

[22] Filed: Jan. 27, 1992

Related U.S. Application Data

[63] Continuation of Ser. No. 542,670, Jun. 22, 1990, abandoned, which is a continuation of Ser. No. 370,959, Jun. 23, 1989, abandoned, which is a continuation of Ser. No. 240,289, Sep. 6, 1988, abandoned, which is a continuation of Ser. No. 43,279, Apr. 27, 1987, abandoned.

[51] Int. Cl.$^5$ ............... H01B 12/06; H01B 39/12; C01G 3/00; C04B 41/89
[52] U.S. Cl. ........................ 505/1; 505/780; 252/518; 252/521; 501/123; 501/151; 501/152; 264/65
[58] Field of Search ............ 505/1, 780, 279; 252/500, 521, 518; 501/152, 123, 151; 264/65

[56] References Cited
PUBLICATIONS

Bednorz et al.; "Possible High Tc Superconductivity in the Ba-La-Cu-O System", Z. Phys. B,—Condensed Matter 64, 189-193 (1986).
Uchida, et al.; "High Tc Superconductivity of La-Ba-Cu Oxides", Japan Journal Applied Physics, vol. 26, No. 1, Jan. 1987, pp. L1-L2.
Takagi et al.; "High-Tc Superconductivity of La-Ba-Cu Oxides II,—Specification of the Super Conducting Phase"; Japanese Journal Applied Physics, vol. 26, No. 2 Feb. 1987 pp. L123-L124.
Uchida, et al.; "High-Tc Superconductivity of La-Ba-Cu Oxides III—Electrical Resistivity Measurement"; Japanese Journal of Applied Physics, vol. 26, No. 2, Feb. 1987, pp. L151-L152.

Primary Examiner—Mark L. Bell
Assistant Examiner—C. M. Bonner
Attorney, Agent, or Firm—Marvin Siskind; Marc Luddy; David Schumaker

[57] ABSTRACT

An oxide type superconducting material comprising a plurality of metal species and oxygen in combined form, said superconducting material improved by the addition of a parametric modifier.

8 Claims, 6 Drawing Sheets

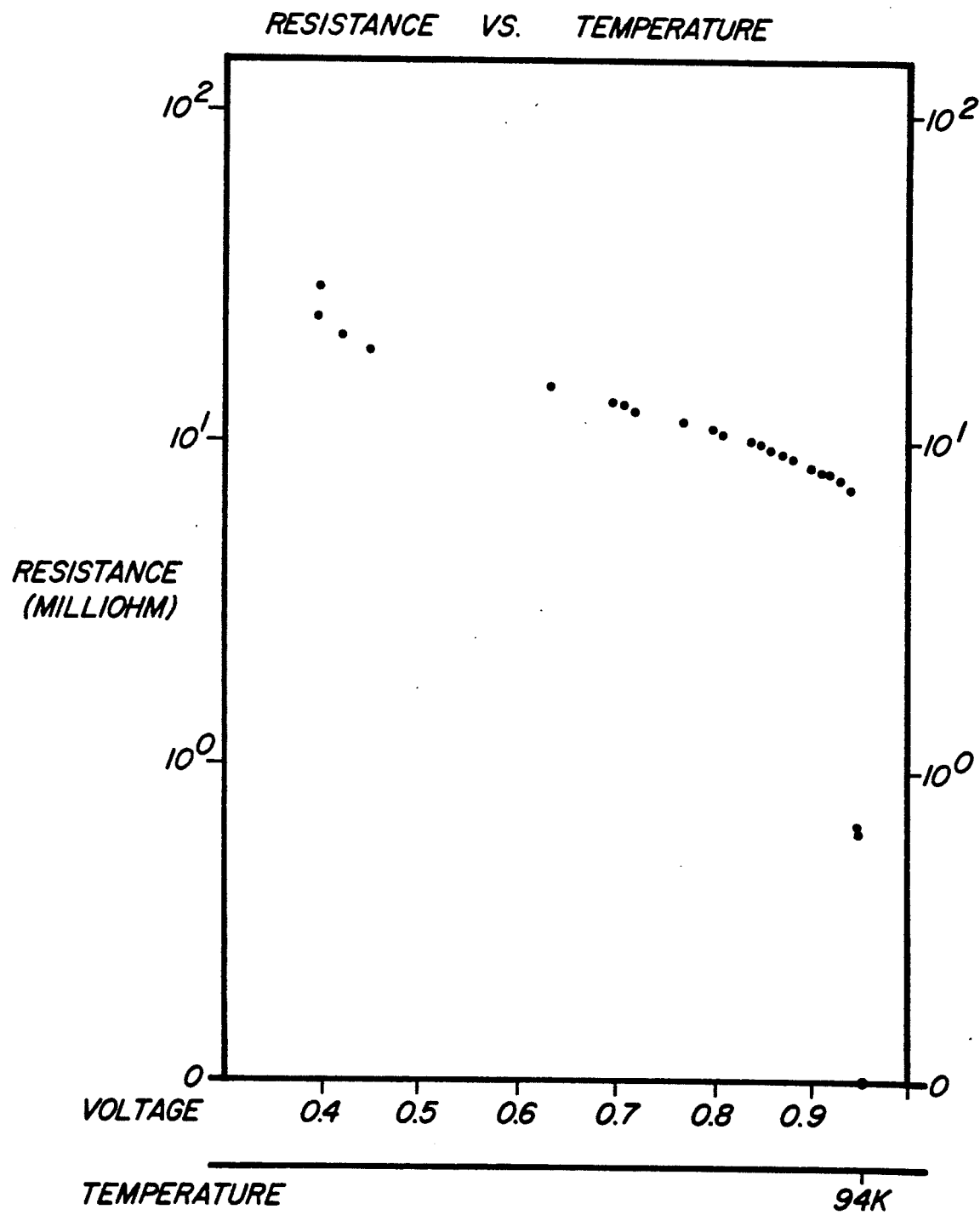

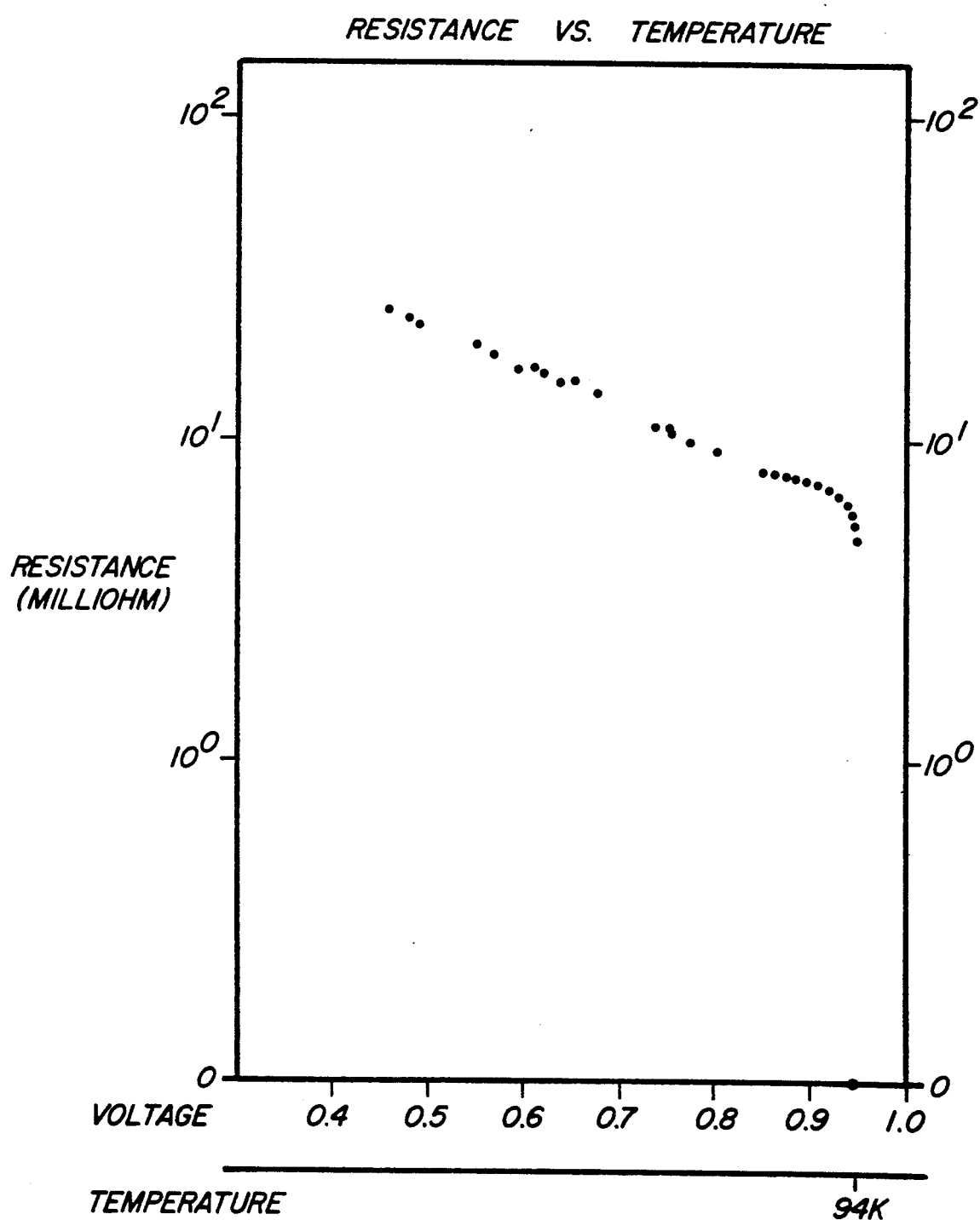

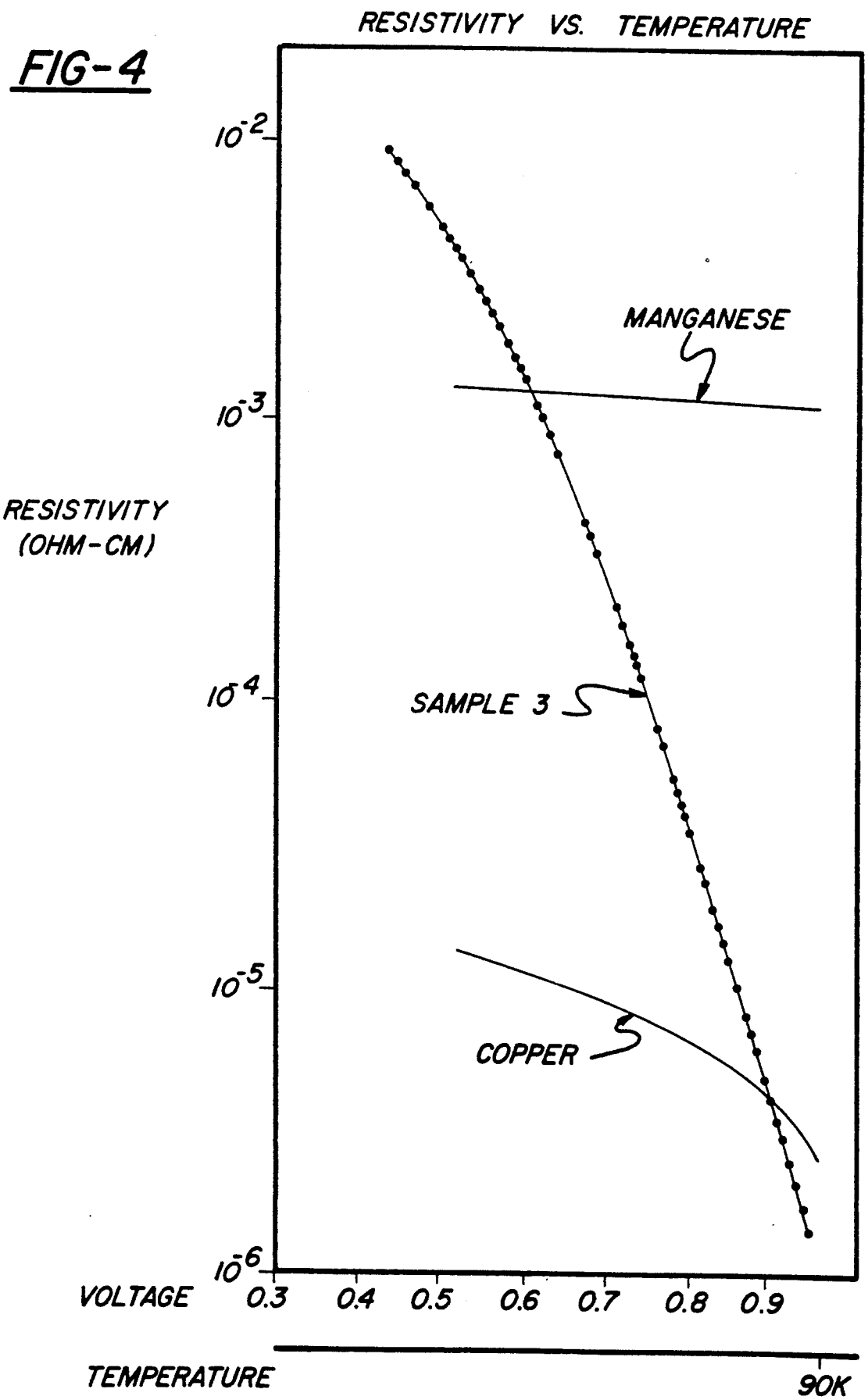

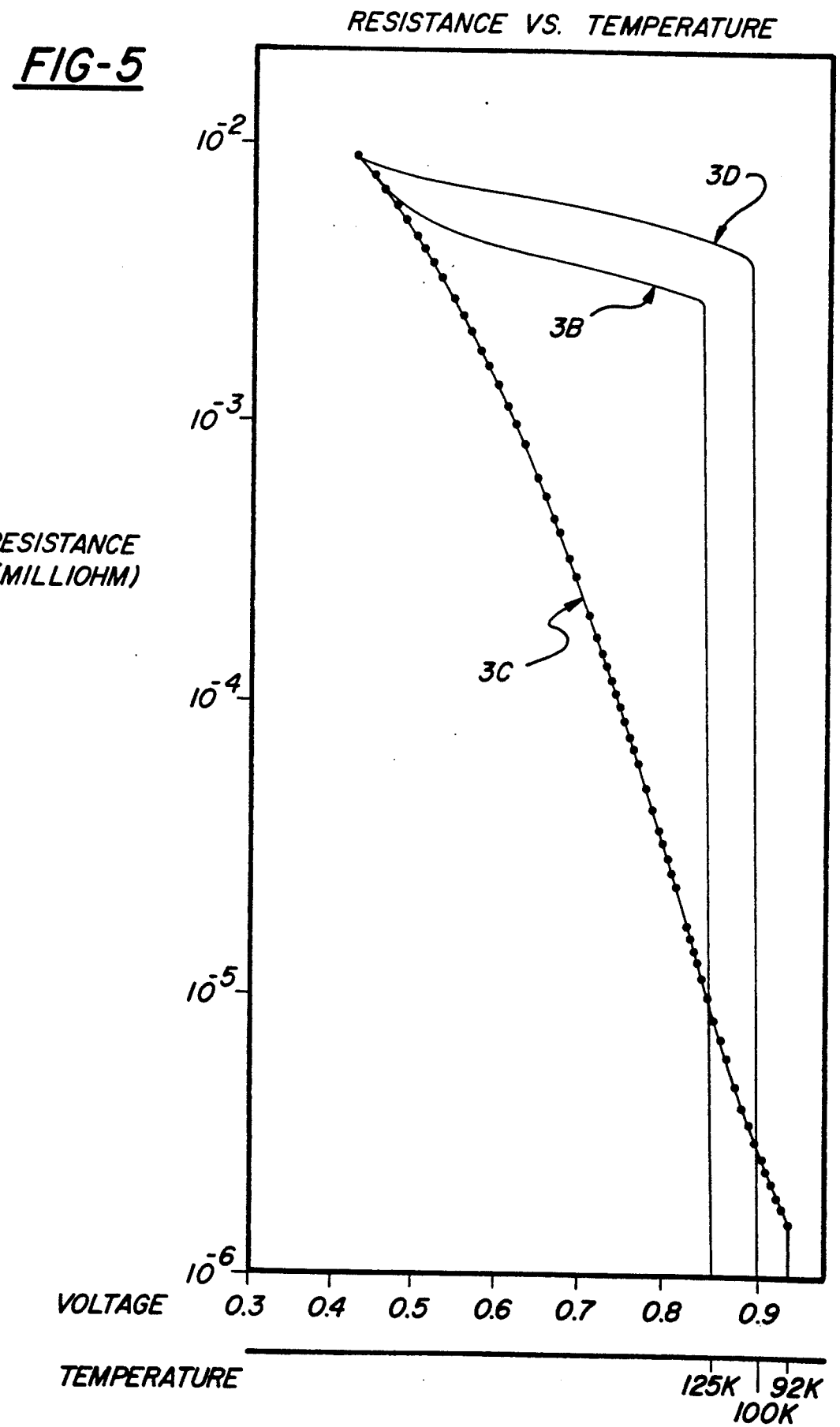

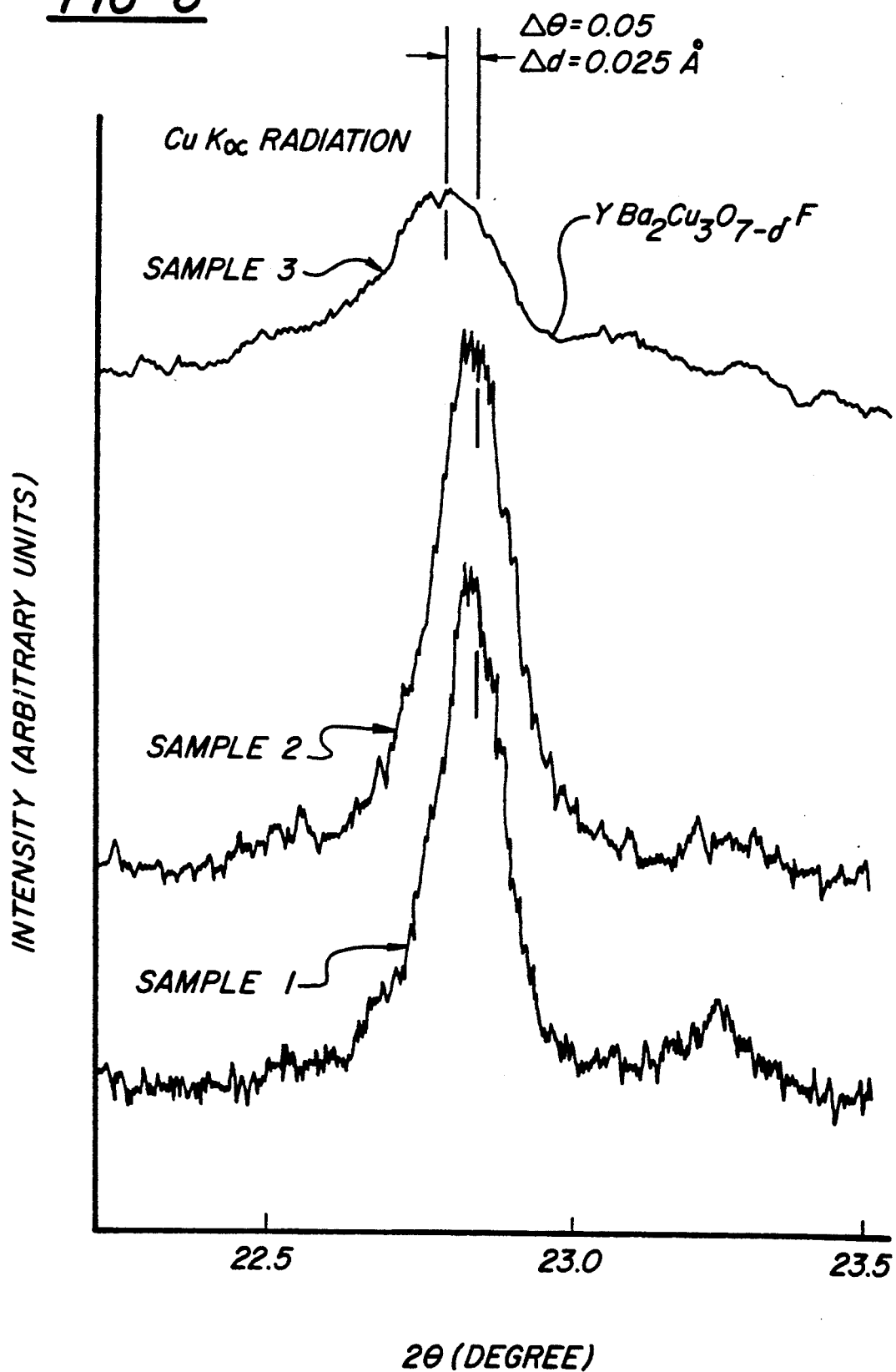

PARAMETRICALLY MODIFIED SUPERCONDUCTOR MATERIAL

This patent application Ser. No. 07/826,290 is a continuation of pending patent application Ser. No. 07/542,670 filed on Jun. 22, 1990 now abandoned, which is a continuation of a application Ser. No. 07/370,959 filed on Jun. 23, 1989 and now abandoned which is a continuation of application Ser. No. 07/240,289 filed on Sep. 6, 1988 and now abandoned which is a continuation of application Ser. No. 07/043,279 filed on Apr. 27, 1987 and now abandoned.

FIELD OF THE INVENTION

The instant invention relates generally to superconducting materials and more specifically to a newly developed class of superconducting materials known as defect oxide perovskite materials to which the subject inventors have added a "parametric modifier" (as defined hereinafter) to improve the superconductive properties thereof.

BACKGROUND OF THE INVENTION

The superconducting properties of certain defect oxide type materials which were variations of a well-known class of inorganic structures called perovskites were first observed in 1986 by Bednorz and Mueller. The materials they observed contained lanthanum, barium, copper, and oxygen, and were reported to be superconducting at 30 degrees Kelvin. Subsequently, many workers in the field became involved in efforts that resulted in the increase of the transition temperature, $T_c$, by the substitution of yttrium for lanthanum.

Workers in the field identified, separated, and characterized the superconducting composition as a perovskite defect oxide of the $Y_1Ba_2Cu_3O_y$ type, possibly an orthorhombically distorted perovskite (See, for example, R. J. Cava, B. Batlogg, R. B. van Dover, D. W. Murphy, S. Sunshine, T. Siegrist, J. P. Remeika, E. A. Reitman, S. Zahurak, and G. P. Espinosa, *Bulk Superconductivity at 91K in Single-Phase Oxygen-Deficient Perovskite $Ba_2YCu_3O_{9-delta'}$*, Phys.Rev.Lett., Vol. 58, (16), pp. 1676-1679, Apr. 20, 1987, incorporated herein by reference, for the crystallographic parameters and the material parameters), also referred to as a tetragonal, square-planar structure (See P. H. Hor, R. L. Meng, Y. Q. Wang, L. Gao, Z. J. Huang, J. Bechtold, K. Forster, and C. W. Chu, *Superconductivity Above 90K in The Square Planar Compound System $ABa_2Cu_3)_{6+x}$ With $A=La, Nd, Sm, Gd, Er, and Lu$*, Mar. 17, 1987) with the $Y_1Ba_2Cu_3O_y$, defect oxide perovskite phase being responsible for the superconducting properties. Further work with this phase effectively raised the critical temperature, $T_c$, to a few degrees above 90 degrees Kelvin (a temperature above the atmospheric boiling point of liquid nitrogen).

Later workers in the field have attempted the total and/or partial replacement of the yttrium and/or lanthanum with other Group IIIA metals (including Rare Earths), especially with scandium, europium, lutetium, neodymium, praseodymium, gadolinium, and ytterbium. The same and other workers in the field have also attempted the total and/or partial replacement of barium with other Group IIA metals, as strontium and calcium.

The defect oxide perovskite phase, having the general composition $M_1^{IIIA}M_2^{IIA}M_3^{IB}O_y$, was identified by several groups utilizing microprobe analysis, x-ray diffraction, scanning electron microscopy, and transmission electron microscopy. These groups have independently characterized this defect oxide perovskite, $M_1^{IIIA}M_2^{IIA}M_3^{IB}O_y$ phase as having the crystallographic unit cell structure shown in FIG. 1.

The perovskite structure is similar to the naturally occurring calcium titanate structure, $CaTiO_3$, also shown by other $AB_2O_3$-type oxides having at least one cation much larger then the other cation or cations, including the tungsten bronzes, $NaWO_3$, strontium titanate, barium titanate, $YAlO_3$, $LaGa_3$, $NaNbO_3$, $KNbO_3$, $KMgF_3$, $KNiF_3$, and $KZnF_3$, among others. In the perovskite structure the larger ions ($La^{+3}=1.15$ Å, $Ba^{+2}=1.35$ Å, and $O^{+2}=1.40$ Å, Linus Pauling, *The Nature of the Chemical Bond*, 3rd Edition, Table 13-3, "Crystal Radii and Univalent Radii of Ions") form a cubic close packed structure, with the smaller ions ($Cu^{+2}=0.96$ Å, $Y^{+3}=0.90$ Å, Pauling, op. cit.) arranged in occupying octahedral interstices in an ordered pattern. Together they form a cubic close packed (face centered cubic) array.

The superconducting perovskite type materials are defect oxides. That is, they are solids in which different kinds of atoms occupy structurally equivalent sites, where, in order to preserve electrical neutrality, some sites are unoccupied.

The structure shown in FIG. 1 has a recurring structure of (1) a $M^{IB}$-O plane of a first type with vacant O sites, (2) a $M^{IIA}$-O plane, (3) a $M^{IB}$-O plane of a second type with fully occupied O sites, (4) a $M^{IIIA}$ plane with O sites, (5), another $M^{IB}$-O plane of the first type with fully occupied O sites, (6) another plane of the $M^{IIA}$-O type, and a (7) a second $M^{IB}$-O plane of the first type, with O site vacancies. It may thus be seen that the unit cell so formed has seven planes.

The central plane is a plane of the $M^{IIIA}$-O type, as a Y-O or La-O plane, with the Group IIIA metal being surrounded at its four coplanar corners by oxygen sites, which may be occupied or vacant. Immediately above and below this $M^{IIIA}$-O plane are equivalent $M^{IB}$-O planes of the second type, i.e., Cu-O planes, with the Group IB metal ions being at the four corners of the plane, and occupied oxygen sites being along each edge of the planes. These square planar $M^{IB}$ atoms (or ions), each surrounded by four oxygen atoms (or ions) have been reported to be critical to superconductivity in the defect oxide perovskites. A pair of $M^{IIA}$-O planes, as Ba-O planes lie atop and below these fully occupied first type $M^{IB}$-O planes. The $M^{IIA}$-O planes, formed with the Group IIA metal, as barium, at the center have fully occupied oxygen sites, with the oxygens disposed directly above and below the Group IB metal sites of the adjacent planes. The $M^{IIA}$-O planes are disposed between $M^{IB}$-O planes, as shown in FIG. 1, with the first type $M^{IB}$-O planes disposed on opposite sides thereof relative to the second type $M^{IB}$-O planes. As mentioned above, the deficiencies, that is, the vacancies (unoccupied sites) reported to reside in the first type $M^{IB}$-O planes are the result of the requirement of electrical neutrality. While the vacancies are generally reported to be in the $M^{IB}$-O planes, they may also be in the other planes, as in the $M^{IIA}$-O planes and/or in the $M^{IIIA}$-O planes.

An accepted theory of superconductivity for "liquid helium temperature range superconducting materials described in the prior art is the Bardeen- Cooper-Schrieffer (BCS) Theory. The BCS Theory explains that superconductivity results from a pairing of conduction electrons. In the paired states electrons cannot easily be scattered and thus lose energy due to collisions with impurities and lattice vibrations. This is much the same loss mechanism that occurs for the unpaired electrons in normally conducting metals. It is this inability of the paired electrons to scatter that results in the zero electrical resistance of the superconductor. The BCS theory predicts the pairing is caused by a net attractive interaction between electrons as a result of interactions between the electrons and vibrations in the crystal lattice. At temperatures below $T_c$ the attractive interaction relative to thermally produced lattice vibrations is strong enough to produce electron pairing.

An equation which is a direct consequence of BCS theory describes the critical temperature material parameters in terms of the following relationship:

$$T_c = 1.14(\Theta_D)\text{EXP}(-1/UD)$$

where $T_c$ is the critical temperature, $(\Theta_D)$ is the Debye Temperature, U is the electron-lattice phonon interaction constant, and D is the electron density of orbitals at the Fermi surface. The Debye temperature, $(\Theta_D)$ is given by the formula:

$$(\Theta_D) = \frac{\bar{h}v}{K_B} \sqrt[3]{6\pi^2 \frac{N}{V}}$$

where $\bar{h}$ is Planck's Constant, v is the velocity of sound in the lattice, $K_B$ is Boltzmann's constant, and N is the number of atoms per volume V in the lattice.

Thus, according to BCS Theory, high $T_c$ superconductive materials are those materials with strong electron-phonon interactions, high Debye temperatures, and large electronic density of states at the Fermi surface. The electron-phonon interaction strength $V^*$, multiplied by the carrier concentration (density of electrons) must be large for high values of $T_c$. This is the case in oxides of nickel ions and of copper ions, which form Jahn-Teller polarons.

While the BCS Theory did not, itself, set an upper temperature limit for superconductivity, it was widely believed that real materials could not be formed having properties that would allow relatively high temperature (above 40-50 K.) superconductivity, given the range of material properties encountered in the materials investigated. However, the recent report of the development of the high temperature superconducting properties of the defect oxide perovskite type superconductors has shattered this once widely held belief.

High critical temperature of about 90 K. has now been reported for the perovskite type, defect oxide superconductors. This represents a much higher critical temperature, $T_c$ then would be predicted by the straight forward application of the preceeding equation from BCS theory.

Clearly, new physical properties (for those perovskite type defect oxide superconductors) are operative not envisioned in the BCS theory as it has been heretofore applied to "liquid helium" temperature range materials.

While the aforementioned researchers have made great strides forward over the course of the last several months in developing this new class of materials, they have not as yet been able to stabilize those materials, nor have they successfully moved the critical temperature a significant amount above the atmospheric boiling point of liquid nitrogen.

BRIEF SUMMARY OF THE INVENTION

The instant inventors, while working with the perovskite, defect oxide class of superconducting materials, have successfully combined at least one "parametric modifier" in the unit cell thereof so as to improve the superconducting properties of that class of materials.

The present invention, in addition to overcoming what had appeared to be a barrier to further increases in critical temperatures of superconductors, provides a new basic mechanism for affecting and controlling the fundamental parameters which determine the critical temperature, opening the door for even further increases in critical temperatures beyond those reported herein.

As used herein, the phrase "parametric modifier" refers to the modification of the local environment and/or the local chemistry of the superconducting material in such a manner as to affect one or more parameters which control the level of the critical temperature of the superconducting phase. Examples of such control parameters are those related to the BCS model (described hereinabove), such as Debye Temperature, number of charge carriers above the Fermi sea, coupling constants and parameters related thereto. The Debye temperature, stated in simplified form, is a function of the stiffness of the lattice; however, it is possible that in a superconductive structure of this complexity, an equivalent structural or other mechanism may be operative in affecting the critical temperature. Hence, the term "effective Debye Temperature" will be used hereinafter to refer to a parameter of this general type. In summary, the parametric modifier thus acts to modify the local chemistry or local environment of the unit cells and/or other structural and chemical configurations from which the superconducting material is fabricated so as to realize changes in the parameters affecting the critical temperature. The parametric modifier may also act to affect the interaction between the otherwise shielded orbitals of adjacent atoms of the unit cell, in particular the d orbitals and in some cases the f orbitals as well. The parametric modifier can additionally act to produce changes in certain parameters which are positive in their effects on the critical temperature while at the same time avoiding otherwise related adverse changes in other parameters which would negatively affect the critical temperature. Thus, normally dependent parameters are uncoupled from one another.

Through yet another mechanism, the parametric modifier may act as a modifier of the local environment controlling the oxidation states, permitting a particular preferred oxidation state for higher critical temperatures to be locked in and/or stabilized.

The local environments in such materials generally include oxygen vacancies which may be viewed as deviations from periodicity or in local order which affect the total interactive environment (TIE). The ability of the modifier to affect such variations from normal structural bonding (NSB) or such deviant electronic configurations (DECs) through modification of the local environment allows manipulation of the critical parameters which affect critical temperature.

It is to be noted that the inventor of the subject invention has previously discussed the coupling and decoupling of various physical properties of superconducting materials by controlling the relationship existing between the atoms thereof on a molecular level; however, this was accomplished for a different class of superconductors and required precision fabrication techniques. See, for example, U.S. Pat. No. 4,520,039, entitled Compositionally Varied Materials And Method For Synthesizing The Materials; U.S. patent application Ser. No. 705,241 of the same title; and U.S. patent application Ser. No. 026,596 entitled Superconducting Materials. In comparison thereto, the special parametric modifiers of the instant inventions provides for the coupling and decoupling of physical properties of superconducting materials of the defect oxide type without complicated fabrication techniques.

BRIEF DESCRIPTION OF THE DRAWINGS

FIG. 2 is a graphic representation, with resistance plotted on the ordinate and temperature plotted on the abscissa, illustrating the onset of superconductivity provided by conventional defect oxide superconducting materials;

FIG. 3 is a graphic representation, with resistance plotted on the ordinate and temperature plotted on the abscissa, illustrating the onset of superconductivity provided by sample No. 2 of the subject invention;

FIG. 4 is a graphic representation, with resistivity plotted on the ordinate and temperature plotted on the abscissa, illustrating the onset of superconductivity provided by sample No. 3A of the subject invention;

FIG. 5 is a graphical representation, with resistance plotted on the ordinate and temperature plotted on the abscissa, illustrating the onset of superconductivity provided by sample Nos. 3B-3D of the subject invention; and FIG. 6 is a graphical representation of the Intensity plotted on the ordinate versus Degrees Two Theta plotted on the abcissa, illustrating a shift in peak intensity in a fluorinated sample of superconducting material.

DETAILED DESCRIPTION OF THE INVENTION

Figure 1:
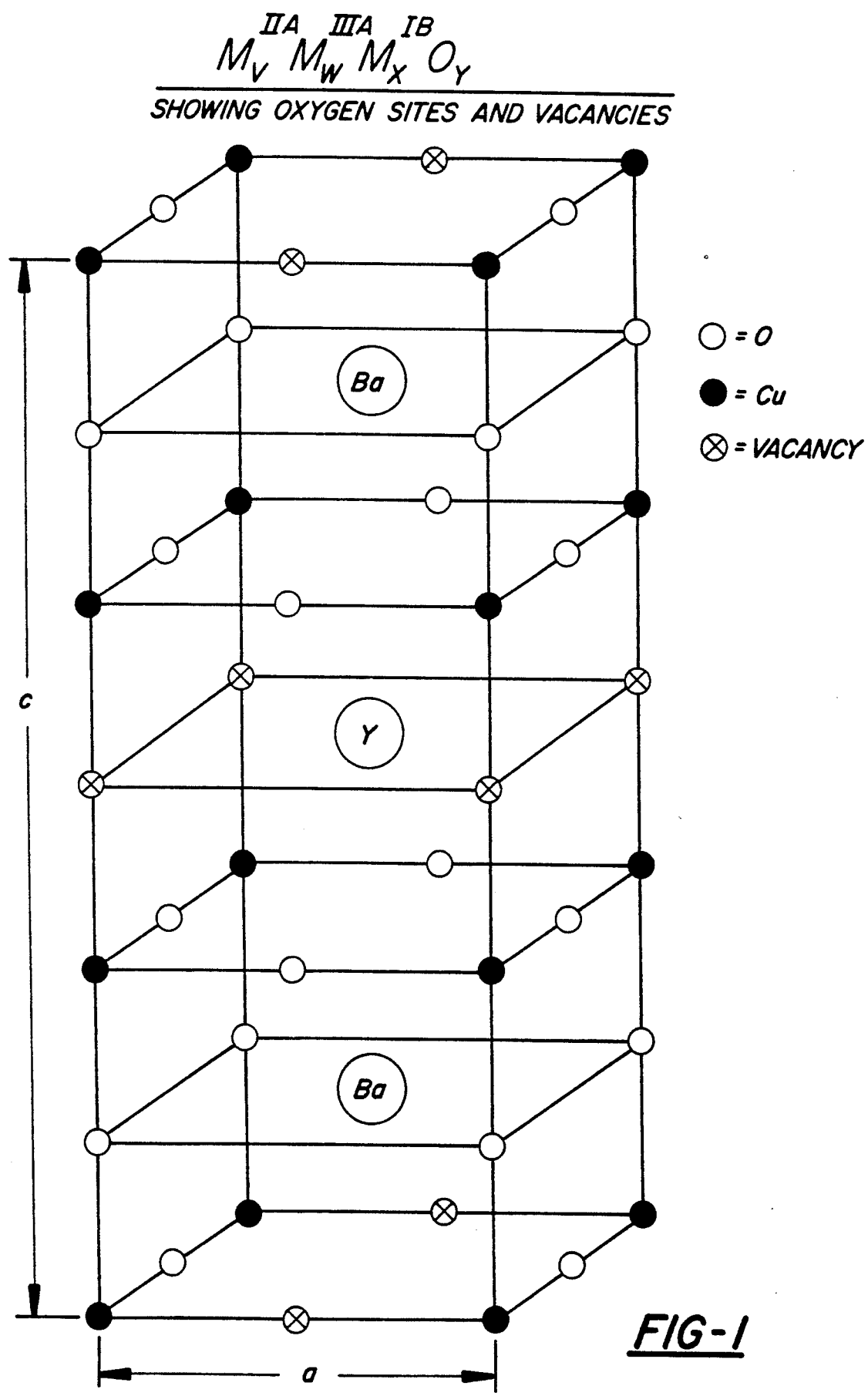
FIG. 1 illustrates the typical unit cell structure of a defect oxide type superconducting material characterized by the composition of $M^{IIB}M^{IIIB}M^{IIA}O$ and particularly depicting the oxygen vacancies present in the CuO planes of that unit cell.

In order to raise the critical temperature, there is provided herein an oxide type superconducting material which comprises a plurality of metal species and oxygen in combined form, the improvement in that superconducting material residing in the inclusion therein of a parametric modifier. The parametric modifier is preferably fluorine. The superconductor has the composition represented by $M^{IIIA}M^{IIIA}M^{IB}OZ$, where $M^{2A}$ is a group IIA metal, $M^{IIIA}$ is a group IIIA metal, $M^{IB}$ is a group IB metal and Z is the parametric modifier. The aforenoted composition is present in the following proportions $M_v^{IIA}M_w^{IIIA}M_x^{IB}O_yZ_z$ where $M^{IIA}$ is a group IIA metal, $M^{IIIA}$ is a group IIIA metal, $M^{IB}$ is a group IB metal, Z is a parametric modifier and wherein v is approximately 2, w is approximately 1, x is approximately 3, y is from 6.5 to 10.5, and generally from 6.5 to 9.0, and z is from 0.1 to 4, and in the range of about 0.1 to 0.4 or higher.

More specifically, the superconducting material may be represented by $La_vBa_wCu_xO_yZ_z$; $La_vBa_wCu_xO_yX_z$; $Y_vBa_wCu_xO_yZ_z$; $Y_vBa_wCu_xO_yF_z$; $La_vSr_wCu_xO_yZ_z$; $La_vSr_wCu_xO_zF_z$; $Y_vSr_xCu_xO_yZ_z$; $Y_vSr_wCu_xO_yF_z$ or other defect oxide type compositions.

The group IIA metal from which the superconducting material is fabricated may be selected from at least one of Ca, Ba and Sr. The group IIIA metal from which the superconducting material is fabricated may be selected from the group consisting of Sc, Y, the rare earth metals, Th and U. The group IB metal from which the superconducting material is fabricated may be selected from the group consisting of at least one of Cu, Ag and Au.

The superconducting material preferably has a perovskite type structure and is a defect oxide. The superconducting material may be characterized by a single value thermal coefficient of electrical conductivity of the $(R)=(T)^a$ type where a is greater than 5 and could be as high as about 8.

There is also disclosed herein a method of forming a superconducting material having the composition represented by $M_v^{IIA}M_w^{IIIA}M_x^{IB}O_yZ_z$ where $M^{IIA}$ is a group IIA metal, $M^{IIIA}$ is a group IIIA metal, $M^{IB}$ is a group IB metal, Z is the parametric modifier, v is approximately 2, w is approximately 1, x is approximately 3, y is from 6.5 to 10.5, and generally from about 6.5 to 9.0, and z is from 0.1 to 4. The steps of the method include forming a mixture of oxide powders of the group IIIA and IB metal and of compounds of the group IIA metal and heating the mixture of powders in an oxidizing environment to form the superconducting material. This may be done in one heating step, or through several repititions. The exact nature of the parametric modifier, the group IIA, the group IIIA metal and the group IB metal are as previously described.

Finally, there is also provided a substantially perovskite, defect oxide superconducting material of the $M_1^{IIA}M_2^{IIIA}M_3^{IB}O_y$ type, said semiconducting material formed of a multiplaned unit cell. At least one $M^{IB}$-O plane of said unit cell includes at least one oxygen vacancy therein, the improvement comprising a parametric modifier element incorporated in at least one oxygen site of the oxygen vacant $M^{IB}$-O planes. The presence of the parametric modifier may enhance the partical-lattice coupling parameter, the particle-to-particle coupling parameter, may increase the number of charge carriers available for conduction, and/or may increase the Debye temperature of the superconducting material. In this manner, the critical temperature of the modified superconducting materials is higher than that of the unmodified superconducting materials of corresponding stoichiometry.

The preferred parametric modifier is fluorine. While the precise nature in which fluorine operates to raise the critical temperature is unknown, it is know that fluorine possesses two inherent attributes which can advantageously effect the unit cell of superconding materials into which it is incorporated; those attributes being its extreme electronegativity and its small atomic size.

EXAMPLE

Five samples of the defect oxide type of superconducting alloys comprising a plurality of metal species and oxygen in combined form were prepared to determine the effect of the incorporation of a parametric modifier, such as fluorine, on the superconducting properties of said alloys. More specifically, the defect oxide alloys were of the $Y_1Ba_2Cu_3O_y$-Modifier$_z$ type. In four of the five samples, the modifier was fluorine, while the remaining one of the samples was fabricated without the incorporation of a parametric modifier. This unmodified sample was utilized as a basis of comparison in order to assess the extent of improvement or deterioration in the superconducting properties exhibited by the parametrically modified defect oxide alloys.

The samples were prepared by blending fluorine containing precursors with non-fluorinated precursors. Specifically, the fluorinated and non-fluorinated precursors were prepared by thoroughly mixing the following powders:

For the fluorine-free presursor material:

| Powder | Mass |
|--------|------|
| $Y_2O_3$ | 1.513 gms |
| $BaCO_3$ | 5.284 gms |
| CuO | 3.198 gms |
| Total | 10.000 grams (80.42 millimoles) |

And for the fluorine-containing precursor material:

| Powder | Mass |
|--------|------|
| $Y_2O_3$ | 1.513 gms. |
| $BaF_2$ | 4.704 gms. |
| CuO | 3.198 gms |
| Total | 9.415 grams. (80.42 millimoles) |

Each of the precursor materials was then heated separately, in air, at standard pressure, in a platinum crucible according to the following time-temperature program:

| Time | Temperature |
|------|-------------|
| 8 hours | 950 degrees Centigrade |
| 16 hours | 200 degrees Centigrade |

After the heating and cool-down process, the two precursor (fluorinated and non-fluorinated) materials were weighed and the following weight losses were observed. The 9.415 gram fluorine-containing precursor material lost 0.2233 grams (the loss believed to be primarily due to the evolution of $O_2$ and possibly fluorine gas), and the ten gram, fluorine-free precursor material lost 1.1204 grams (the large weight loss believed to be primarily due to the evolution of $CO_2$ and secondarily due to the evolution of $O_2$).

Five samples were then weighed out from combinations of the aforedescribed powdered precursor materials. Each of the samples were mixed so as to incorporate the following relative percentages of the precursor materials:

| Sample No. | Fluorinated | Non-Fluorinated |
|------------|-------------|-----------------|
| 1 | None | 100 percent |
| 2 | 0.410 gms. | 1.162 gms. |
| 3 | 0.820 gms. | 0.775 gms. |
| 4 | 1.229 gms. | 0.387 gms. |
| 5 | 100 percent | None |

Each of the five samples were then pressed into a pellet-like configuration measuring approximately 1 centimeter in diameter by approximately 3 millimeters in thickness. The five pellets were spacedly placed into a commercial grade alumina crucible in a such a manner that only opposed side wall edges of the pellets contacted the alumina walls of the crucible. The pellets were then fired in an oxygen furnace at standard pressure according to the following time-temperature program:

| Time | Temperature |
|------|-------------|
| 6 hours | Ramped from 200 degrees up to 950 degrees Centigrade |
| 48 hours | 950 degrees Centigrade |
| 6 hours | Ramped from 950 degrees Centigrade down to 200 degrees Centigrade in situ |

The five pellets were then removed from the alumina crucible, cut into a plurality of slices and the electrical properties thereof were measured. More particularly, each of the pellets was cut in a plane parallel to the upper and lower surfaces thereof and then multiple cuts were made in a direction perpendicular to that plane. The slices so formed were subjected to the aforementioned electrical measurements by affixing a single one of said slices to the end of an elongated four point contact probe, of the type well known to workers in the field of superconductivity, with the two intermediate contacts used for voltage measurement and the two remote contacts used for supplying current to the sample. The probe was lowered into a tank, the lower portion of which is filled with liquid helium. As should be apparent, when the probe is lowered into closer proximity to the liquid helium, the temperature of the pellet slice is moved closer to that of said helium, the temperature of the probe and sample being a function of both the vertical separation from the liquid helium and the residence time thereof in the tank. In this manner, changes in the potential placed across said slice as the temperature of the sample changes are measured. By closely monitoring the voltage and slowly changing the temperature of said sample, the zero resistance (superconducting) temperature of the sample can be accurately determined. Below the critical temperature, the critical currents are above 100 amperes per square centimeter.

It is in precisely this manner that the curves illustrated in FIGS. 2–5 were prepared. Note that plotted on the ordinate is the resistance of the sample in milliohms while plotted on the abscissa is the voltage of a silicon diode (Model No. DT-500K purchased from and calibrated by Lake Shore Cryotronics, Inc. in Westerville, Ohio) which is thermally in parallel with the sample. The voltage across said silicon diode is correlated, in the manner provided in the following table, to the temperature of the sample.

| Voltage (Volts) | Temperature (Kelvin) | DV/DT MV/DEG |
|-----------------|----------------------|--------------|
| 1.0060 | 70.00 | −2.46 |
| 0.9936 | 75.00 | −2.51 |
| 0.9803 | 80.00 | −2.56 |
| 0.9861 | 85.00 | −2.59 |
| 0.9551 | 90.00 | −2.60 |
| 0.9420 | 95.00 | −2.62 |
| 0.9289 | 100.00 | −2.64 |
| 0.9156 | 105.00 | −2.66 |
| 0.9023 | 110.00 | −2.66 |
| 0.8889 | 115.00 | −2.67 |
| 0.8756 | 120.00 | −2.68 |
| 0.8622 | 125.00 | −2.69 |
| 0.8487 | 130.00 | −2.71 |
| 0.8351 | 135.00 | −2.72 |
| 0.8214 | 140.00 | −2.73 |
| 0.8077 | 145.00 | −2.73 |

-continued

| Voltage (Volts) | Temperature (Kelvin) | DV/DT MV/DEG |
|---|---|---|
| 0.7941 | 150.00 | −2.73 |
| 0.7804 | 155.00 | −2.73 |
| 0.7668 | 160.00 | −2.73 |
| 0.7531 | 165.00 | −2.74 |
| 0.7394 | 170.00 | −2.75 |
| 0.7256 | 175.00 | −2.76 |
| 0.7118 | 180.00 | −2.78 |
| 0.6978 | 185.00 | −2.80 |
| 0.6838 | 190.00 | −2.81 |
| 0.6697 | 195.00 | −2.81 |
| 0.6557 | 200.00 | −2.81 |
| 0.6416 | 205.00 | −2.80 |
| 0.6277 | 210.00 | −2.79 |
| 0.6137 | 215.00 | −2.79 |
| 0.5998 | 220.00 | −2.78 |
| 0.5859 | 225.00 | −2.76 |
| 0.5722 | 230.00 | −2.74 |
| 0.5586 | 235.00 | −2.71 |
| 0.5450 | 240.00 | −2.68 |
| 0.5317 | 245.00 | −2.65 |
| 0.5185 | 250.00 | −2.63 |
| 0.5054 | 255.00 | −2.60 |
| 0.4924 | 260.00 | −2.60 |
| 0.4794 | 265.00 | −2.60 |
| 0.4664 | 270.00 | −2.62 |
| 0.4532 | 275.00 | −2.65 |
| 0.4399 | 280.00 | −2.68 |
| 0.4264 | 285.00 | −2.72 |
| 0.4127 | 290.00 | −2.75 |
| 0.3989 | 295.00 | −2.77 |
| 0.3850 | 300.00 | −2.79 |

The following results were obtained from selected slices of certain of the aforementioned pellet samples.

| Pellet Number | Thermal Coefficient of Resistivity (Ohm-cm) per deg K. | Transition Temperature Degrees K. |
|---|---|---|
| 1 | | 90 K. |
| 2 | | 90 K. |
| 3-A | $T^8$ | 92 K. |
| 3-B | | 125 K. |
| 4 | | None |
| 5 | | None |

Referring now specifically to the temperature versus resistivity curves obtained by the aforedescribed techniques for accurately measuring the temperature and conductivity for each of the superconductive samples, FIGS. 2-3 depict representative curves for samples 1 and 2. These Figures provide a base-line for comparison by illustrating the relatively conventional onset of superconductivity, said onset marked by a sharp increase in conductivity over a very narrow temperature range. In the case of the fluorine-free material of sample No. 1 shown in FIG. 2, the onset temperature interval of superconductivity occurs over approximately a 2.5 degree K. temperature range. The resulting onset is similar for the fluorine-containing material of sample No. 2, shown in FIG. 3; i.e., the onset temperature interval of superconductivity occurred over the substantially identical degree K. temperature range.

Turning now to FIG. 4 which is a temperature versus resistivity curve for slice A of sample 3, said sample having the characteristic stoichiometry of $Y_1Ba_2Cu_3O_5F_3$, several features thereon are noteworthy. Firstly, while the superconducting temperature of the sample remained in the 90K range, the material exhibited approximately an order of magnitude decrease from room temperature conductivity. Secondly, the slope of the curve fell by approximately a power of 8, as shown in the plot of Resistivity versus Temperature. For the sake of comparison, the temperature versus resistivity curve for highly purified copper is superimposed onto the FIG. 4 curve and clearly reveals the surprisingly steep slope of the sample 3 plot as well as the synergistic discovery that said sample becomes more conductive than copper from the temperature range at which said plots cross all the way out to the critical temperature of copper. For the sake of additional comparison, the plot of temperature versus resistivity of manganese has also been superposed onto the FIG. 4 curve to illustrate the relatively flat slope associated therewith as compared to even the purified copper, more or less the defect oxide-type superconducting material of the subject invention. Finally, it is significant to note that the experience of the instant inventors has demonstrated that superconducting materials of this defect oxide class which exhibit a characteristic slope, even remotely similar to the slope of the defect oxide superconductor illustrated in FIG. 4, have, upon further investigation, revealed the presence of still higher critical temperature phase material. Therefore, it is speculated that the above material will provide a superconducting phase of much higher critical temperature.

Referring now to FIG. 5, there is depicted therein a resistance versus temperature curve for slices B-D cut from the sample 3 pellet. Specifically, electrical measurements of the 3B slice revealed a critical temperature of about 125K.; electrical measurements of the 3D slice revealed a critical temperature of about 100K. From these measurements it thus becomes apparent that: (1) a critical temperature of 125K. (the highest $T_c$ reported to date) can be attained through the combination of a parametric modifier of the instant invention with defect oxide superconductors; (2) the parametric modifier, fluorine, has a substantial affect on the local chemical environment of the defect oxide type of superconducting material and hence it is possible that the parametric modifier is responsible for microscopic (molecular order) differences in the local chemical environment of the unit cell thereof, which difference may alter the thermal cooling or change the d and f orbital relationships existing between the metal species of said superconducting material. For instance, it is known by the instant inventors that the d orbitals are directional and depending upon the orientation thereof, different oxidation states can exist. Accordingly, the parametric modifier, fluorine, as described herein, is responsible not only for providing an exciting new material for further scientific investigation, but it has offered physicists the possibility of expanding the scope of their present knowledge of the behavior of such defect oxide semiconducting materials.

Two regions of the superconducting phase of the 125 Kelvin slice of sample 3 was analyzed by x-ray spectroscopy. These two regions had the following elemental analysis:

| Elemental Analysis of First Region | | |
|---|---|---|
| Element | Weight Percent | Atomic Percent |
| O | 16.13 | 54.33 |
| F | 0.07 | 0.20 |
| Cu | 25.64 | 21.74 |
| Y | 13.75 | 8.33 |
| Ba | 39.26 | 15.40 |

| -continued Elemental Analysis of First Region | | |
|---|---|---|
| Element | Weight Percent | Atomic Percent |
| (Does not total 100%) | | |

| Elemental Analysis of Second Region | | |
|---|---|---|
| Element | Weight Percent | Atomic Percent |
| O | 19.28 | 57.27 |
| F | 0.08 | 0.20 |
| Cu | 27.66 | 20.69 |
| Y | 14.11 | 7.54 |
| Ba | 41.31 | 14.30 |
| (Does not total 100%) | | |

The crystal structures of three slices of samples 1, 2, and 3 were determined by x-ray diffraction. These patterns are shown in FIG. 6. Sample 3, having 125 kelvin regions, showed a shift of 0.05 degrees two theta, and a change in interplanar spacing of 0.025 Å from the values for Sample 1 (no added F) and Sample 2 (where F was in the sample, but was determined to be solely in the form of $BaF_2$, and not in the defect oxide perovskite phase). This shows a significant and irrebuttable correlation between (1) incorporation of F in the defect oxide perovskite superconducting phase, (2) the crystallographic parameters of the defect oxide superconducting phase, and (3) the superconducting $T_c$. Therefore the 125 kelvin material of sample 3 represents a new material, of new crystallographic parameters and enhanced superconducting parameters.

There remains one final feature of the illustrated curves which is noteworthy, although the importance of that feature is not understood. The instant inventors have observed that, for some of the slices of Sample 3, as the critical temperature of the sample 3 slices of superconducting material decreases, the slope of the curves also decreases. More particularly, the slope of the resistivity versus temperature curve for the 90K superconducting material is flatter than the shape of the resistivity versus temperature curve for the 125K material.

It should finally be noted that although the instant invention has been described primarily with respect to YBaCuO examples of superconducting defect oxide type materials, the instant invention is not so limited and has direct applicability to all defect oxide type superconducting materials which comprise a plurality of metal species and oxygen in combined form and which rely on the formation of oxygen vacancies in at least one of the $M^{IB}$-O planes of the unit cell thereof. Therefore, modifications and variations of the present invention are possible in light of the teachings provided herein. Accordingly, it is to be understood that such modifications and variations are to be included within the scope of the appended claims.

What is claimed is:

1. A material having at least one superconducting phase and having the composition represented by the formula $Y_wBa_vCu_xO_yF_z$, where w is about 1, v is about 2, x is about 3, y is from about 6.5 to about 10.5 and z is from about 0.1 to about 4.

2. A material having at least one superconducting phase and having the composition represented by the formula $Y_wBa_vCu_xO_yF_z$, where w is about 1, v is about 2, x is about 3, y is from about 6.5 to about 10.5 and z is from about 0.1 to about 4;

said material formed by the method including the steps of:
  a. forming a mixture of materials, said mixture of materials including the elements Y, Ba, Cu, O and F;
  b. pressing the mixture into a cohesive solid mass; and
  c. heating the solid mass in an oxidizing environment to form a material having at least one superconducting phase.

3. The material of claim 2 wherein said step of forming said mixture of materials includes the further step of forming said mixture from at least two separate precursor mixtures.

4. The material of claim 3 wherein the step of forming said mixture from at least two separate precursor mixtures includes the steps of forming the first of said precursor mixtures including the elements Y, Ba, Cu and O, forming the second of said precursor mixtures including the elements Y, Ba, Cu, O and F and mixing the precursor mixtures.

5. The material of claim 4 wherein said step of forming said mixture of materials further includes the step of heating said precursor mixtures before mixing the precursor mixtures.

6. The material of claim 5 wherein said step of heating said precursor mixtures includes a first step of heating said precursor mixtures in air at a temperature of about 950° C. for about 8 hours and a second step of heating said precursor mixtures in air at a temperature of about 200° C. for about 16 hours.

7. The material of claim 2 wherein said step of heating the solid mass in an oxidizing environment includes the step of heating said solid mass in a gas including oxygen.

8. The material of claim 2 wherein said step of heating the solid mass includes the steps of increasing the temperature of said solid mass from about 200° C. to about 950° C. in about 6 hours, holding the temperature of said mass at about 950° C. for about 48 hours and reducing the temperature of said mass from about 950° C. to about 200° C. in about 6 hours.

* * * * *